(12) United States Patent
Ting et al.

(10) Patent No.: US 8,587,047 B2
(45) Date of Patent: Nov. 19, 2013

(54) CAPACITOR FORMATION FOR A PUMPING CIRCUIT

(75) Inventors: Yu-Wei Ting, Taipei (TW); Shing-Hwa Renn, Taipei County (TW); Yu-Teh Chiang, Taipei (TW); Chung-Ren Li, Hsinchu County (TW); Tieh-Chiang Wu, I-Lan Hsien (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 1240 days.

(21) Appl. No.: 12/101,161

(22) Filed: Apr. 11, 2008

(65) Prior Publication Data

US 2009/0189251 A1 Jul. 30, 2009

(30) Foreign Application Priority Data

Jan. 29, 2008 (TW) ................ 97103260 A

(51) Int. Cl.
*H01L 27/108* (2006.01)
*H01L 29/94* (2006.01)

(52) U.S. Cl.
USPC ............. 257/301; 257/68; 257/302; 257/303; 257/304; 257/305; 257/E27.097; 257/E29.201; 257/E29.257; 257/E29.26; 257/E29.346; 257/E21.396; 257/E21.651; 438/243; 438/244; 438/259; 438/270; 438/386

(58) Field of Classification Search
USPC ............ 257/68, 301–305, E27.097, E27.095, 257/E29.201, E29.257, E29.26, E29.346, 257/E21.396, E21.651; 438/243, 244, 259, 438/270, 386–392
See application file for complete search history.

(56) References Cited

U.S. PATENT DOCUMENTS

| | | | |
|---|---|---|---|
| 4,794,434 A * | 12/1988 | Pelley, III | ...... 257/301 |
| 4,918,503 A | 4/1990 | Okuyama | |
| 2004/0048433 A1 * | 3/2004 | Takahashi | ...... 438/238 |

* cited by examiner

*Primary Examiner* — Meiya Li
(74) *Attorney, Agent, or Firm* — Winston Hsu; Scott Margo

(57) ABSTRACT

A capacitor structure for a pumping circuit includes a substrate, a U-shaped bottom electrode in the substrate, a T-shaped top electrode in the substrate and a dielectric layer disposed between the U-shaped bottom and T-shaped top electrode. The contact area of the capacitor structure between the U-shaped bottom and T-shaped top electrode is extended by means of the cubic engagement of the U-shaped bottom electrode and the T-shaped top electrode.

5 Claims, 5 Drawing Sheets

CAPACITOR FORMATION FOR A PUMPING CIRCUIT

BACKGROUND OF THE INVENTION

1. Field of the Invention

The present invention relates to a capacitor structure. In particular, the present invention relates to a capacitor structure for a pumping circuit.

2. Description of the Prior Art

In the conventional dynamic random access memory (DRAM) structure, the pumping circuit plays an essential role in generating high voltage for driving the cells for operation. With the progress of the technology of the DRAM, the workload of pumping circuits become heavier and heavier because the initial voltage ($V_{int}$) may drop to relatively low 1.0 V to 1.5 V when the voltage to drive the cells to operate remains at a relatively high voltage.

The pumping efficiency of the pumping circuit mainly lies in the value of the capacity in the pumping circuit. The greater the capacity, the greater the pumping efficiency and a higher output voltage may be provided. The value of the capacity usually depends on the contact area between the top electrode plate and the bottom electrode plate. How to increase the contact area between the top electrode plate and the bottom electrode plate becomes a crucial subject matter.

However, with the development of the technology of the DRAM, the allocation of the more and more limited spaces on the substrate becomes more and more critical. Because regular planar capacitors are employed in the conventional DRAMs, it greatly restrains the possibility from increasing the contact area between the top electrode plate and the bottom electrode plate. In order to thoroughly solve the problem that there is a gap between the operational voltage for driving the cells and the initial voltage, there is a need to come up with a solution to increase the contact area between the top electrode plate and the bottom electrode plate.

SUMMARY OF THE INVENTION

The present invention therefore provides a novel capacitor structure with increased capacity to a great extent. The capacity is elevated by cubically increasing the contact area between the top electrode plate and the bottom electrode plate.

The capacitor structure for a pumping circuit of the present invention includes a substrate, a U-shaped bottom electrode disposed in the substrate, a T-shaped top electrode disposed in the substrate and engaged with the U-shaped bottom electrode and a dielectric layer disposed between the U-shaped bottom electrode and the T-shaped top electrode. Because the T-shaped top electrode engages with the U-shaped bottom electrode cubically, the contact area between the top electrode plate and the bottom electrode plate is extended as much as possible in a given space, so the capacity of the pumping circuit is accordingly greatly increased.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
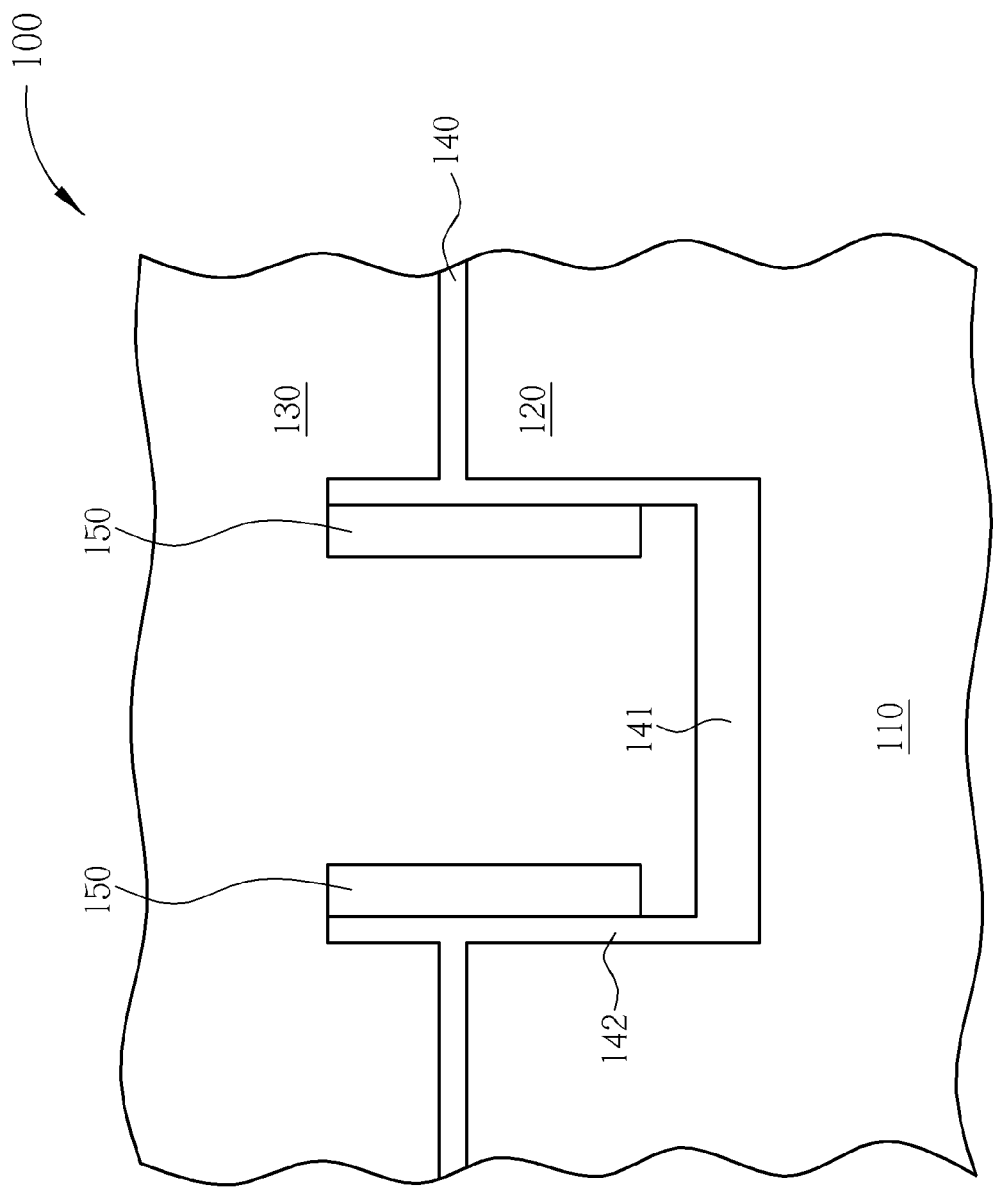
FIG. 1 illustrates a preferred embodiment of the capacitor structure of the present invention.

The capacitor structure of the present invention provides a pumping circuit with highly increased capacity, so as to maximize the pumping efficiency in a limited space. Please refer to FIG. 1, illustrating a cross section figure of a preferred embodiment of the capacitor structure of the present invention. The capacitor structure 100 of the present invention includes a substrate 110, a U-shaped bottom electrode 120, a T-shaped top electrode 130 and a dielectric layer 140. The substrate 110 is usually a semiconductor material such as Si.

The U-shaped bottom electrode 120 is disposed and indented in the substrate 110. The U-shaped bottom electrode 120 may be formed of the same material as the substrate and is conductive by conventional methods, such as ion-implantation. The dielectric layer 140 is conformally disposed on a top surface of the U-shaped bottom electrode 120 and directly contacts the U-shaped bottom electrode 120 to isolate the T-shaped top electrode 130 from said U-shaped bottom electrode 120. The dielectric layer 140 usually includes a material of high dielectric constant (high k), such as silicon oxide, or any other suitable dielectric material. Usually, the thickness of the dielectric layer 140 may be 3 nm-10 nm. Besides, the thickness of the dielectric layer 140 in the horizontal direction 141 and in the vertical direction 142 may be different. For example, a thicker oxide layer may be obtained after a thermal oxidation procedure if fluorine ions are implanted into the substrate in advance. On the other hand, a thinner oxide layer may be obtained if nitrogen ions are implanted into the substrate in advance. The thickness of the dielectric layer 140 in the horizontal direction 141 may be 3.8 nm and the thickness of the dielectric layer 140 in the vertical direction 142 may be 5 nm for example.

The T-shaped top electrode 130 is disposed on the dielectric layer 140. As a result that the dielectric layer 140 is conformally disposed on the top surface of the U-shaped bottom electrode 120, the T-shaped top electrode is fitted and inlayed therein. By the different words, the T-shaped top electrode 130 has an extension which is integrally formed with the T-shaped top electrode 130 and extended into and mated with the indented U-shaped bottom electrode 120. The T-shaped bottom electrode 130 usually includes a conductive material, such as lightly ion-doped poly-Si, and engages with the U-shaped bottom electrode 120. The contact area of the capacitor structure 100 between the top electrode 130 and the bottom electrode 120 is extended by means of the engagement of the U-shaped bottom electrode 120 and the T-shaped top electrode 130.

Figure 2A:
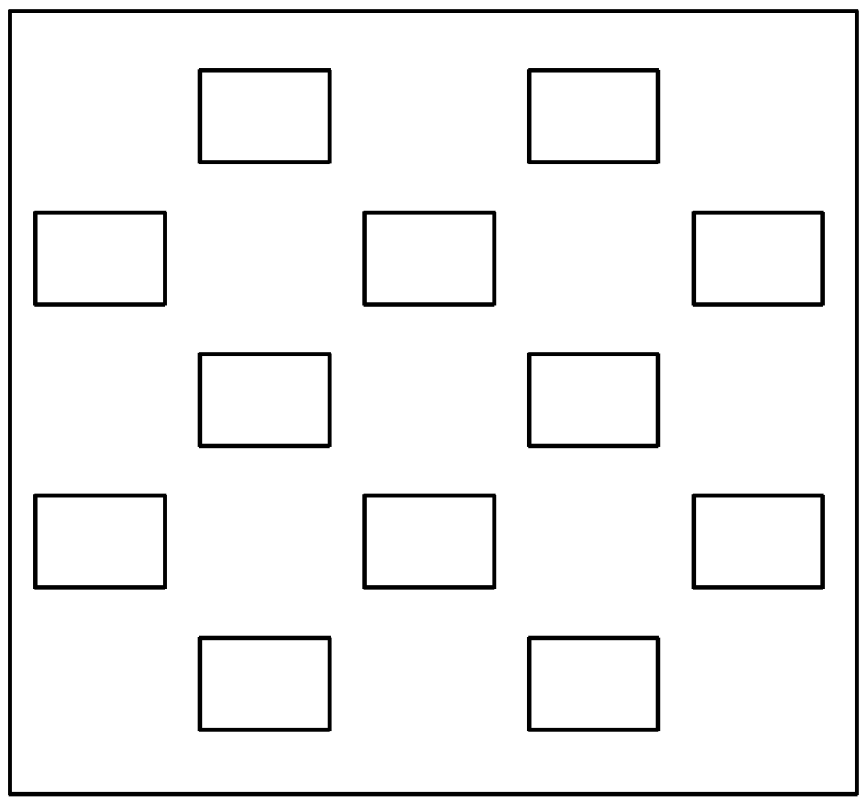
FIGS. 2A/2B illustrate some possible layouts of the capacitor structure of the present invention.
Figure 2B:
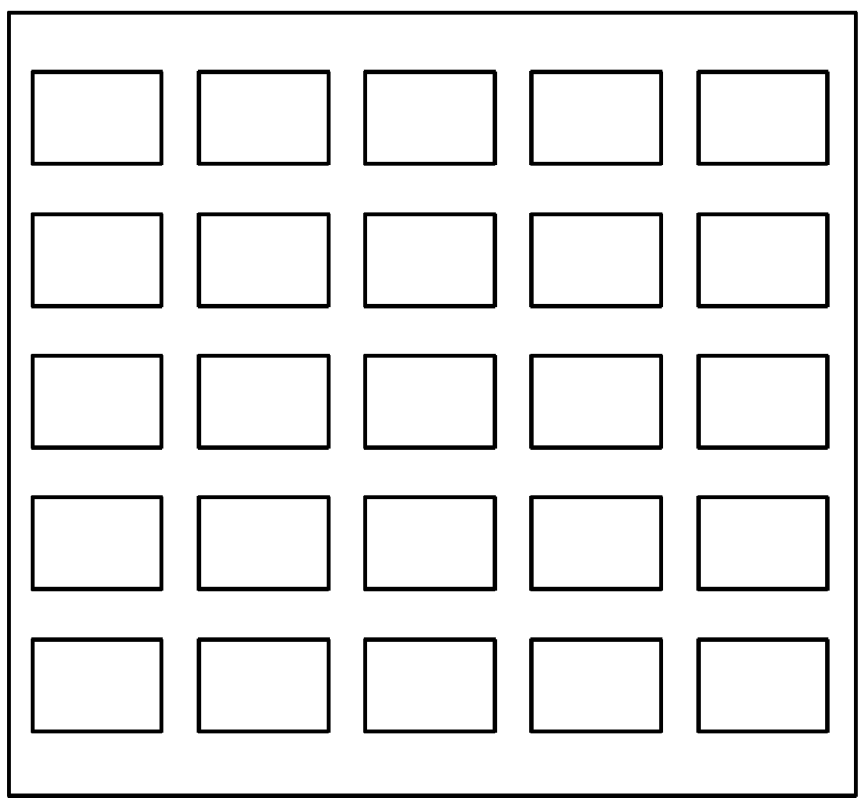

FIGS. 2A/2B illustrate some possible layouts of the capacitor structure 100 of the present invention. For example, FIG. 2A illustrates an alternating type layout and FIG. 2B illustrates a check board type layout. Different layouts are useful in different scenarios.

Figure 3:
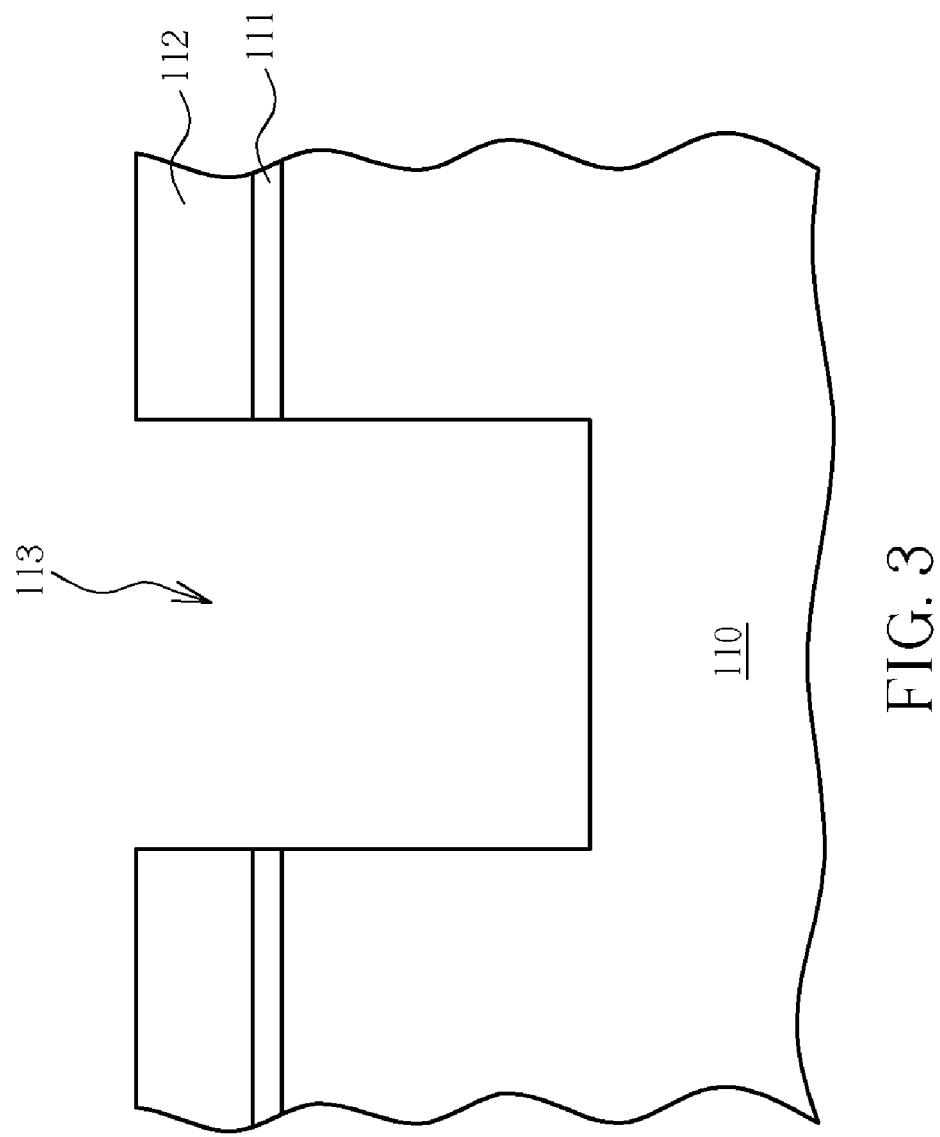
FIGS. 3-4 illustrate a preferred embodiment of forming the capacitor structure of the present invention.
Figure 4:
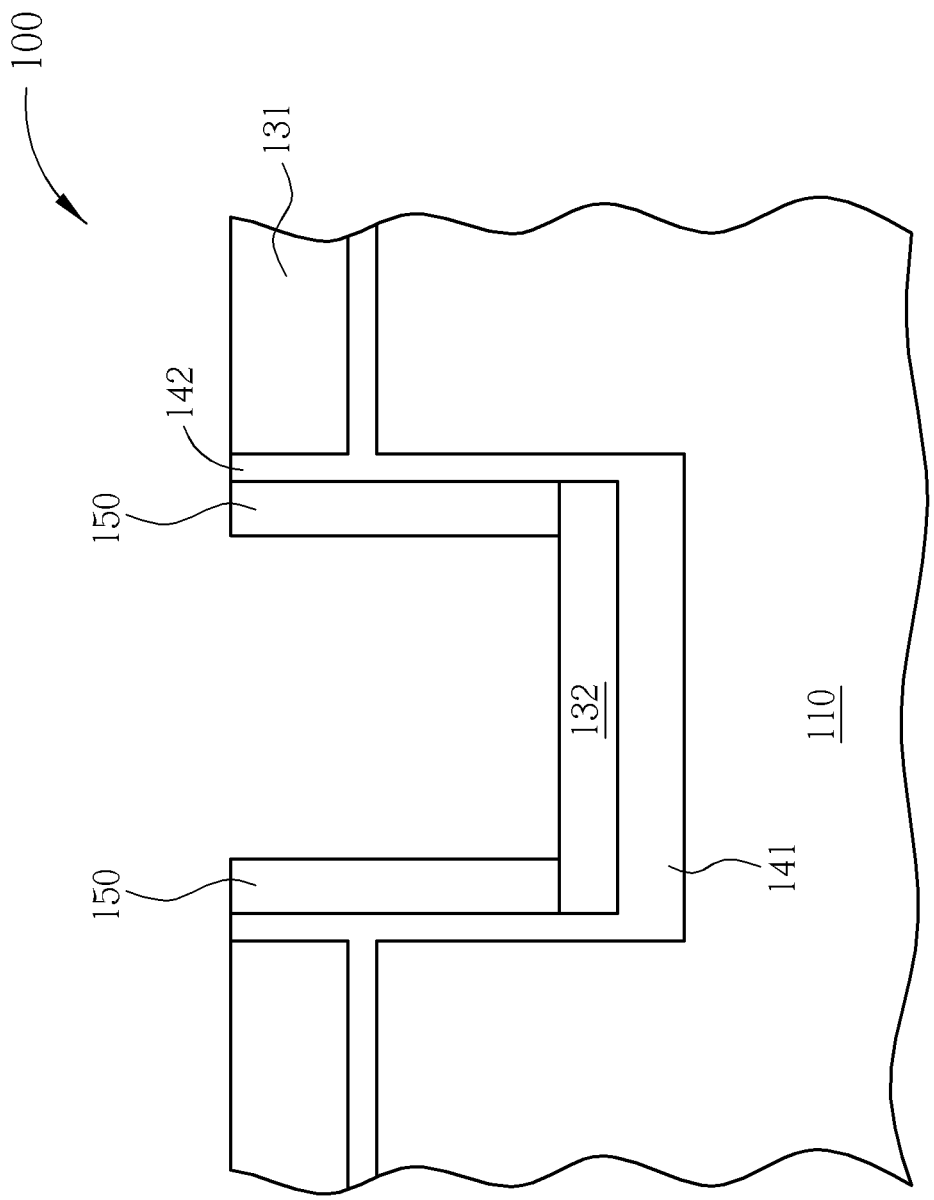

Please refer to FIGS. 3-4, illustrating a preferred embodiment of forming the capacitor structure of the present invention. First, please refer to FIG. 3. A substrate 110 is provided. An oxide layer 111 and a poly-Si layer 112 are formed thereon and a trench 113 is formed through the oxide layer 111 and the poly-Si layer 112 in the substrate 110. The depth of the trench 113 is optional.

Please refer to FIG. 4. After the trench 113 is formed in the substrate 110, a dielectric layer is then formed on a surface of the trench 113. The dielectric layer comprises a horizontal dielectric layer 141 and a vertical dielectric layer 142. The horizontal dielectric layer 141 and the vertical dielectric layer 142 in the trench 113 are formed by an oxidation procedure, such as a steam oxidation procedure. Optionally, there may be an additional inner spacer 150 formed in the trench 113 and on a part of a sidewall of the vertical dielectric layer 142. The thickness of the dielectric layer 140 in the horizontal direction 141 and in the vertical direction 142 may be different. For example, a thicker oxide layer may be obtained after a thermal oxidation procedure if fluorine ions are implanted into the substrate in advance. On the other hand, a thinner oxide layer may be obtained if nitrogen ions are implanted into the substrate in advance.

Please refer to FIG. 1. The capacitor structure 100 is completed after an additional poly-Si layer is deposited to form the T-shaped top electrode 130. The capacity of the capacitor structure 100 is increased due to an additional peripheral contact surface of the indented portion between the T-shaped top electrode 130 and the U-shaped bottom electrode 120. The T-shaped top electrode 130 is composed of the poly-Si layer 112, the poly-Si layer 131/132 and the final poly-Si layer. It is another feature of the present invention that the above-mentioned process is compatible with the convention DRAM process.

Those skilled in the art will readily observe that numerous modifications and alterations of the device and method may be made while retaining the teachings of the invention.

What is claimed is:

1. A capacitor structure for a pumping circuit comprising:
a substrate;
a bottom electrode formed in said substrate and having an indented portion;
a top electrode formed on said substrate and having an extension integrally formed with said top electrode and extended into and mated with said indented portion;
a dielectric layer sandwiched between said bottom electrode and said top electrode to isolate said top electrode from said bottom electrode, wherein a horizontal direction of said dielectric layer has a thickness different from that of a vertical direction of said dielectric layer,
whereby capacity of said capacitor structure for said pumping circuit is increased due to an additional peripheral contact surface of said indented portion between said top electrode and said bottom electrode; and
an inner spaced disposer on part of a sidewall of said vertical direction of said dielectric layer, and spaced apart from the horizontal direction of said dielectric layer, wherein the total length of the inner spacer is longer than the total distance extending directly from the bottom surface of the inner spacer to the topmost surface of the horizontal direction of said dielectric layer.

2. The capacitor structure for a pumping circuit of claim 1, wherein said bottom electrode comprises ion-doped silicon.

3. The capacitor structure for a pumping circuit of claim 2, wherein said top electrode comprises ion-doped silicon.

4. The capacitor structure for a pumping circuit of claim 1, wherein said dielectric layer has a thickness of 3 nm-10 nm.

5. The capacitor structure for a pumping circuit of claim 1, wherein said horizontal direction of said dielectric layer has a thickness thicker than that of said vertical direction of said dielectric layer.

* * * * *